United States Patent
Nasu et al.

(10) Patent No.: US 6,781,179 B2
(45) Date of Patent: Aug. 24, 2004

(54) SEMICONDUCTOR DEVICE HAVING A CAPACITOR COMPRISING AN ELECTRODE WITH AN IRIDIUM OXIDE FILM AS AN OXYGEN BARRIER FILM

(75) Inventors: Toru Nasu, Kyoto (JP); Yoshihisa Nagano, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/152,774

(22) Filed: May 23, 2002

(65) Prior Publication Data

US 2002/0179947 A1 Dec. 5, 2002

(30) Foreign Application Priority Data

May 30, 2001 (JP) ........................................ 2001-162901

(51) Int. Cl.[7] .............................................. H01L 27/108
(52) U.S. Cl. ........................ 257/296; 257/295; 257/310; 438/3; 438/238; 438/239; 438/386; 438/399
(58) Field of Search ................................ 257/295, 296, 257/306–310, 68, 71, 298, 300, 301, 516, 536; 438/3, 238, 239, 243–253, 369–399; 361/302–305, 310–312

(56) References Cited

U.S. PATENT DOCUMENTS

2001/0022374 A1 * 9/2001 Nakamura .................. 257/296

2002/0117700 A1 * 8/2002 Fox ............................ 257/295

FOREIGN PATENT DOCUMENTS

| JP | 06-235065 | 8/1994 |
| JP | 11-87651 | 3/1999 |

OTHER PUBLICATIONS

Y. Sato, "Various Methods for Producing Electrochromic Iriduim Oxide Films", Journal of the Society of Photographic Science and Technology of Japan, vol. 51, No. 1, p. 3, 1998.

L.M. Schiavone et al., "Electrochromic iridium oxide films prepared by reactive sputtering", Applied Physics Letters, vol. 35, Issue 10, Nov. 1979.

* cited by examiner

Primary Examiner—David Nelms
Assistant Examiner—Long Tran
(74) Attorney, Agent, or Firm—McDermott Will & Emery LLP

(57) ABSTRACT

The semiconductor memory device of the present invention includes: an interlayer insulating film formed on a semiconductor substrate; a contact plug formed to extend through the interlayer insulating film; and a capacitor formed on the interlayer insulating film so that an electrode of the capacitor is connected with the contact plug. The electrode has an iridium oxide film as an oxygen barrier film. The average grain size of granular crystals constituting the iridium oxide film is a half or less of the thickness of the iridium oxide film.

10 Claims, 6 Drawing Sheets

PRIOR ART

SEMICONDUCTOR DEVICE HAVING A CAPACITOR COMPRISING AN ELECTRODE WITH AN IRIDIUM OXIDE FILM AS AN OXYGEN BARRIER FILM

BACKGROUND OF THE INVENTION

The present invention relates to an iridium oxide film, and more particularly, to an iridium oxide film used as an electrode of a stacked ferroelectric memory cell, and a method for fabricating such an iridium oxide film.

In recent years, research and development on ferroelectric films having the spontaneous polarization property have been actively done for success in commercialization of nonvolatile RAMs permitting high-speed write/read operation at a low operating voltage.

In semiconductor memories using a high dielectric film or ferroelectric film described above as a capacitor insulating film, if megabit-scale highly-integrated memories are desired, stacked memory cells are used in place of conventional planer memory cells.

The stacked memory cells have the following problem. A contact plug extends through an interlayer insulating film covering a field effect transistor. The face of the contact plug in contact with a lower electrode of a capacitor formed on the interlayer insulating film must be prevented from being oxidized during high-temperature heat treatment in an oxygen atmosphere, which is required for crystallization of an insulating metal oxide constituting the ferroelectric or high dielectric film.

To overcome the above problem, an iridium oxide film, a conductive oxide film, is normally formed between the contact plug and the lower electrode as an oxygen barrier film.

As a method for forming the iridium oxide film, reactive sputtering is proposed, in which an iridium metal target is subjected to sputtering and sputtered iridium is oxidized near a substrate (Journal of the Society of Photographic Science and Technology of Japan (1988), Vol. 51, No. 1, p. 3).

However, in the above publication, no examination is made on specific conditions for improving the oxygen barrier property of the iridium oxide film formed by reactive sputtering.

The conventional technique therefore fails to ensure improvement of the oxygen barrier property of the iridium oxide film.

SUMMARY OF THE INVENTION

An object of the present invention is providing a semiconductor memory device including an iridium oxide film as an oxygen barrier film for an electrode of a capacitor, in which improvement of the barrier property of the iridium oxide film is ensured.

To attain the above object, the first semiconductor memory device of the present invention includes: an interlayer insulating film formed on a semiconductor substrate; a contact plug formed to extend through the interlayer insulating film; and a capacitor formed on the interlayer insulating film, an electrode of the capacitor being connected with the contact plug, wherein the electrode has an iridium oxide film as an oxygen barrier film, and the average grain size of granular crystals constituting the iridium oxide film is a half or less of the thickness of the iridium oxide film.

According to the first semiconductor memory device of the invention, the average grain size of granular crystals constituting the iridium oxide film is a half or less of the thickness of the iridium oxide film. Therefore, diffusion paths for oxygen atoms in the iridium oxide film have curves. This makes it difficult for oxygen atoms to diffuse along grain boundaries, and thus the oxygen barrier property of the iridium oxide film improves with certainty.

In the first semiconductor memory device, the thickness of the iridium oxide film is preferably 200 nm or less.

By setting as described above, it is ensured that the average grain size of granular crystals constituting the iridium oxide film is a half or less of the thickness of the iridium oxide film.

The second semiconductor memory device of the invention includes: an interlayer insulating film formed on a semiconductor substrate; a contact plug formed to extend through the interlayer insulating film; and a capacitor formed on the interlayer insulating film, an electrode of the capacitor being connected with the contact plug, wherein the electrode has an iridium oxide film as an oxygen barrier film, and the iridium oxide film has a plurality of layers different in average crystal grain size from each other.

According to the second semiconductor memory device of the invention, the iridium oxide film as an oxygen barrier film has a plurality of layers different in average crystal grain size from each other. Therefore, it is difficult for oxygen atoms to diffuse along grain boundaries of crystals constituting one of the layers having a smaller average crystal grain size, and thus the oxygen barrier property of the iridium oxide film improves. In addition, the layer having a larger average crystal grain size serves to improve the adhesion to a film in contact with the oxygen barrier film.

In the second semiconductor memory device, preferably, a lower layer of the plurality of layers has a comparatively large average crystal grain size, and an upper layer of the plurality of layers has a comparatively small average crystal grain size.

With the above construction, the upper layer can block diffusion of oxygen atoms coming from the upper side of the oxygen barrier film, while the lower layer can improve the adhesion to a film formed on the lower side of the oxygen barrier film.

Preferably, the thickness of the lower layer is 30 nm or less, and the thickness of the upper layer is 200 nm or less.

By setting as described above, it is ensured that the upper layer blocks diffusion of oxygen atoms while the lower layer improves the adhesion to a film formed on the lower side of the oxygen barrier film.

The third semiconductor memory device of the present invention includes: a field effect transistor formed on a semiconductor substrate; an interlayer insulating film formed to cover the field effect transistor; a contact plug formed to extend through the interlayer insulating film and connected with a source region or a drain region of the field effect transistor; and a capacitor formed on the interlayer insulating film, a lower electrode of the capacitor being connected with the contact plug, wherein the lower electrode has an iridium oxide film as an oxygen barrier film, and the average grain size of granular crystals constituting the iridium oxide film is a half or less of the thickness of the iridium oxide film.

According to the third semiconductor memory device of the invention, the average grain size of granular crystals constituting the iridium oxide film is a half or less of the thickness of the iridium oxide film. Therefore, diffusion paths for oxygen atoms in the iridium oxide film have curves. This makes it difficult for oxygen atoms to diffuse along grain boundaries, and thus the oxygen barrier property of the iridium oxide film improves with certainty.

In the third semiconductor memory device, the thickness of the iridium oxide film is preferably 200 nm or less.

By setting as described above, it is ensured that the average grain size of granular crystals constituting the iridium oxide film is a half or less of the thickness of the iridium oxide film.

The fourth semiconductor memory device of the present invention includes: a field effect transistor formed on a semiconductor substrate; an interlayer insulating film formed to cover the field effect transistor; a contact plug formed to extend through the interlayer insulating film and connected with a source region or a drain region of the field effect transistor; and a capacitor formed on the interlayer insulating film, a lower electrode of the capacitor being connected with the contact plug, wherein the lower electrode has an iridium oxide film as an oxygen barrier film, and the iridium oxide film has a plurality of layers different in average crystal grain size from each other.

According to the fourth semiconductor memory device of the invention, the iridium oxide film as an oxygen barrier film has a plurality of layers different in average crystal grain size from each other. Therefore, it is difficult for oxygen atoms to diffuse along grain boundaries of crystals constituting one of the layers having a smaller average crystal grain size, and thus the oxygen barrier property of the iridium oxide film improves. In addition, the layer having a larger average crystal grain size serves to improve the adhesion to a film in contact with the oxygen barrier film.

In the fourth semiconductor memory device, preferably, a lower layer of the plurality of layers has a comparatively large average crystal grain size, and an upper layer of the plurality of layers has a comparatively small average crystal grain size.

With the above construction, the upper layer can block diffusion of oxygen atoms coming from the upper side of the oxygen barrier film, while the lower layer can improve the adhesion to a film formed on the lower side of the oxygen barrier film.

Preferably, the thickness of the lower layer is 30 nm or less, and the thickness of the upper layer is 200 nm or less.

By setting as described above, it is ensured that the upper layer blocks diffusion of oxygen atoms while the lower layer improves the adhesion to a film formed on the lower side of the oxygen barrier film.

The first fabrication method of the present invention is a method for fabricating a semiconductor memory device including: an interlayer insulating film formed on a semiconductor substrate; a contact plug formed to extend through the interlayer insulating film; and a capacitor formed on the interlayer insulating film, an electrode of the capacitor being connected with the contact plug, the electrode having an iridium oxide film as an oxygen barrier film. The method includes the step of: forming the iridium oxide film by reactive sputtering with oxygen gas and argon gas fed into a reaction chamber, a target including indium being placed in the chamber, wherein the reactive sputtering is performed under the condition satisfying an expression $x/(x+y)>0.5$ wherein x is the actual partial pressure of the oxygen gas in the reaction chamber and y is the actual partial pressure of the argon gas in the reaction chamber.

The second fabrication method of the present invention is a method for fabricating a semiconductor memory device including: a field effect transistor formed on a semiconductor substrate; an interlayer insulating film formed to cover the field effect transistor; a contact plug formed to extend through the interlayer insulating film and connected with a source region or a drain region of the field effect transistor; and a capacitor formed on the interlayer insulating film, a lower electrode of the capacitor being connected with the contact plug, the lower electrode having an iridium oxide film as an oxygen barrier film. The method includes the step of: forming the iridium oxide film by reactive sputtering with oxygen gas and argon gas fed into a reaction chamber, a target including indium being placed in the chamber, wherein the reactive sputtering is performed under the condition satisfying an expression $x/(x+y)>0.5$ wherein x is the actual partial pressure of the oxygen gas in the reaction chamber and y is the actual partial pressure of the argon gas in the reaction chamber.

According to the first and second methods for fabricating a semiconductor memory device of the invention, the ratio of oxygen gas to argon gas fed into the reaction chamber is made large. This changes the atoms colliding against the target for causing sputtering from argon atoms to oxygen atoms, and thus decreases the kinetic energy of sputtered grains. With decreased kinetic energy, the average crystal grain size of grains constituting the iridium oxide film is made small.

Therefore, according to the first and second fabrication methods, diffusion paths for oxygen atoms in the iridium oxide film have curves. This makes it difficult for oxygen atoms to diffuse along grain boundaries, and thus the oxygen barrier property of the iridium oxide film improves with certainty.

In addition, since the iridium oxide film can be formed on the substrate having a temperature kept equal to or higher than room temperature, the adhesion between the contact plug and the lower electrode of the capacitor improves.

The third fabrication method of the present invention is a method for fabricating a semiconductor memory device including: an interlayer insulating film formed on a semiconductor substrate; a contact plug formed to extend through the interlayer insulating film; and a capacitor formed on the interlayer insulating film, an electrode of the capacitor being connected with the contact plug, the electrode having an iridium oxide film as an oxygen barrier film, the iridium oxide film having a plurality of layers different in average crystal grain size from each other. The method includes the step of: forming the iridium oxide film by reactive sputtering with oxygen gas and argon gas fed into a reaction chamber, a target including indium being placed in the chamber, wherein the reactive sputtering is performed under the condition satisfying an expression $x/(x+y)<0.5$, wherein x is the actual partial pressure of the oxygen gas in the reaction chamber and y is the actual partial pressure of the argon gas in the reaction chamber, in the first stage, and under the condition satisfying an expression $x/(x+y)>0.5$ in the subsequent second stage.

The fourth fabrication method of the present invention is a method fabricating a semiconductor memory device comprising: a field effect transistor formed on a semiconductor substrate; an interlayer insulating film formed to cover the field effect transistor; a contact plug formed to extend through the interlayer insulating film and connected with a source region or a drain region of the field effect transistor; and a capacitor formed on the interlayer insulating film, a lower electrode of the capacitor being connected with the contact plug, the lower electrode having an iridium oxide film as an oxygen barrier film, the iridium oxide film having a plurality of layers different in average crystal grain size from each other. The method includes the step of: forming the iridium oxide film by reactive sputtering with oxygen gas and argon gas fed into a reaction chamber, a target including indium being placed in the chamber, wherein the reactive sputtering is performed under the condition satisfying an expression x/(x+y)<0.5 wherein x is the actual partial pressure of the oxygen gas in the reaction chamber and y is the actual partial pressure of the argon gas in the reaction chamber, in the first stage, and under the condition satisfying an expression x/(x+y)>0.5 in the subsequent second stage.

According to the third and fourth methods for fabricating a semiconductor memory device of the invention, in the first stage, the reactive sputtering is performed under the condition satisfying an expression x/(x+y)<0.5. Therefore, the kinetic energy of sputtered grains is large, and this improves the adhesion between the contact plug and the lower electrode. In the second stage, the reactive sputtering is performed under the condition satisfying an expression x/(x+y)>0.5. Therefore, the kinetic energy of sputtered grains is small, and this decreases the average crystal grain size of grains constituting the iridium oxide film.

Thus, according to the third and fourth fabrication methods, the adhesion between the contact plug and the electrode of the capacitor improves, and also the oxygen barrier property of the iridium oxide film improves.

Preferably, the first to fourth methods for fabricating a semiconductor memory device further include the step of subjecting the iridium oxide film to heat treatment at a temperature in a range of 500° C. to 600° C. in a nitrogen atmosphere.

DESCRIPTION OF THE PREFERRED EMBODIMENTS

Embodiment 1

The semiconductor memory device and the fabrication method thereof of Embodiment 1 of the present invention will be described with reference to FIGS. 1 to 6.

Figure 1:
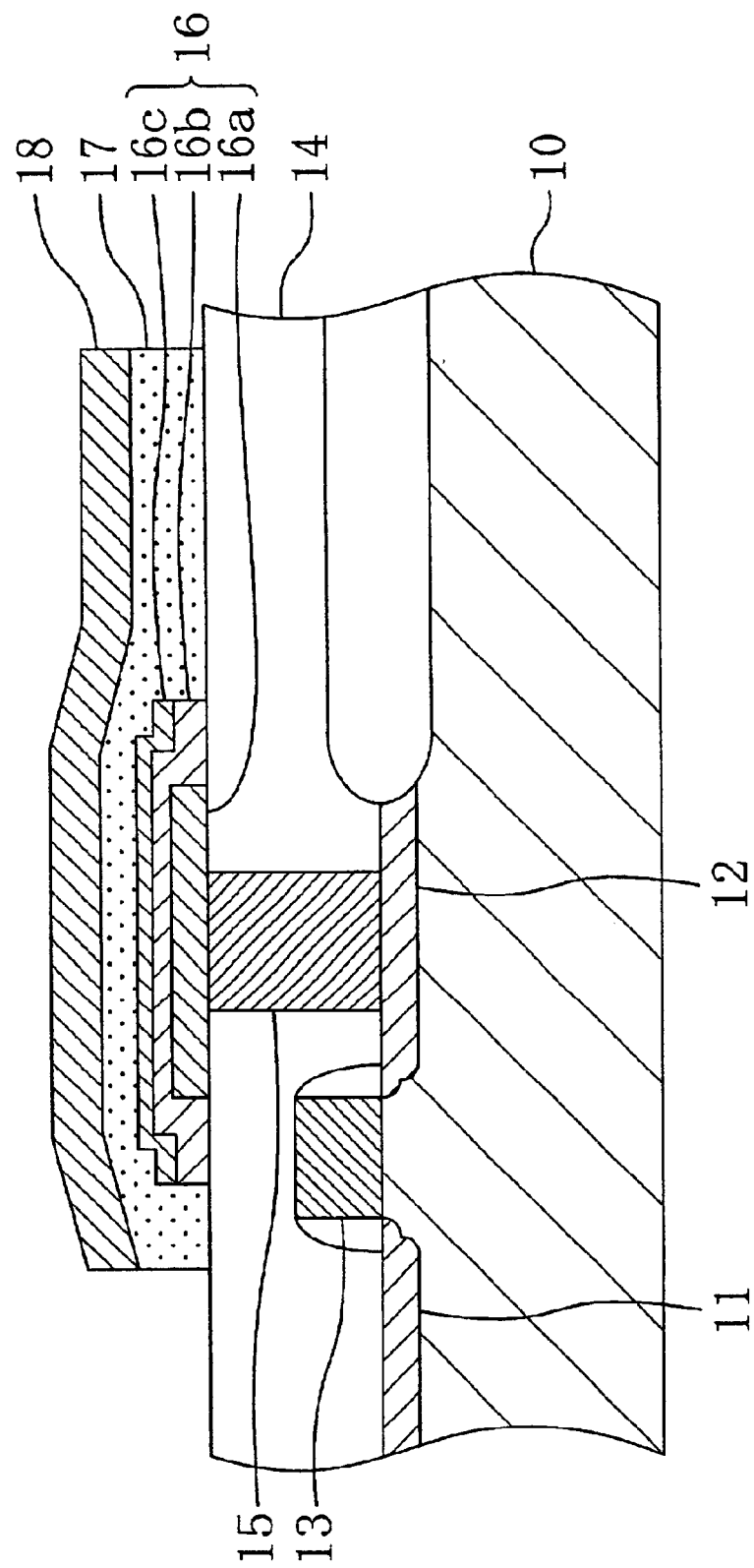
FIG. 1 is a cross-sectional view of a semiconductor memory device of Embodiment 1 of the present invention.

As shown in FIG. 1, a source region 11 and a drain region 12 are formed in the surface portion of a semiconductor substrate 10, and a gate electrode 13 is formed on the semiconductor substrate 10. The source region 11, the drain region 12 and the gate electrode 13 constitute a field effect transistor (FET).

An interlayer insulating film 14 is formed on the semiconductor substrate 10 covering the FET. A contact plug 15 made of polysilicon extends through the interlayer insulating film 14 to be in contact with the drain region 12.

A lower electrode 16 of a capacitor is formed on the interlayer insulating film 14 to be in contact with the contact plug 15. The lower electrode 16 is composed of a first conductive barrier film 16a, a second conductive barrier film 16b and a metal film 16c formed sequentially in this order.

The first conductive barrier film 16a is made of a titanium film having a thickness of 20 nm, for example, a titanium aluminum nitride film having a thickness of 40 nm, for example, and an indium film having a thickness of 100 nm, for example, deposited sequentially in this order, and has a function of preventing diffusion of polysilicon constituting the contact plug 15.

The second conductive barrier film 16b is made of an iridium oxide film having a thickness of 160 nm, for example, and covers the top surface and sides of the first conductive barrier film 16a. The second conductive barrier film 16b has a function of preventing the first conductive barrier film 16a from being oxidized during high-temperature heat treatment in an oxygen atmosphere for crystallizing an insulating metal oxide constituting a capacitor insulating film 17 to be described later.

The metal film 16c is made of a platinum film having a thickness of 50 nm, for example.

The capacitor insulating film 17 having a thickness of 160 nm, for example, is formed on the interlayer insulating film 14 covering the lower electrode 16. The capacitor insulating film 17 is made of $SrBi_2(Ta_{1-x}Nb_x)O_9$(wherein $0 \leq x \leq 1$) having a bismuth layered perovskite structure, for example.

An upper electrode 18 of the capacitor, which is made of a platinum film having a thickness of 100 nm, for example, is formed on the capacitor insulating film 17.

Hereinafter, the second conductive barrier film 16b as the oxygen barrier film, which is the feature of this embodiment, will be described.

Oxygen diffuses along grain boundaries of crystals constituting the oxygen barrier film. Therefore, to improve the barrier property of the oxygen barrier film, (1) the oxygen barrier film may be made of columnar crystals exhibiting high orientation property, to increase the compactness of the grain boundaries serving as diffusion paths for oxygen atoms, or (2) the grain size of crystals constituting the oxygen barrier film is made small, to provide curves for the diffusion paths for oxygen atoms.

When the iridium oxide film is formed by sputtering, the resultant film is poor in orientation property. Therefore, the method (2), not the method (1), is suitable for improvement of the oxygen barrier property of the iridium oxide film.

In the method (2), to provide curves for the diffusion paths for oxygen atoms, the average crystal grain size must be a half or less of the film thickness.

Figure 2A:
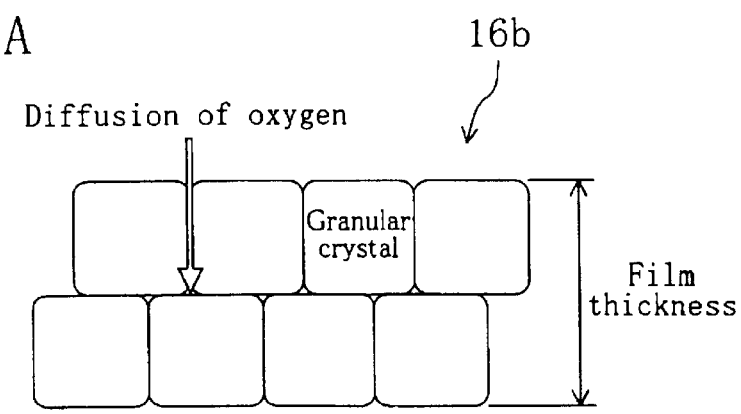
FIG. 2A is a cross-sectional view of a second conductive barrier film (oxygen barrier film) of the semiconductor memory device of Embodiment 1 of the invention.
Figure 2B:
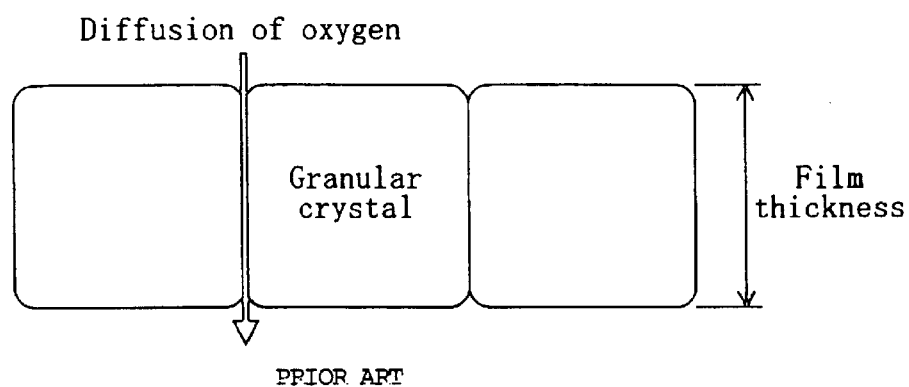
FIG. 2B is a cross-sectional view of an oxygen barrier film of a conventional semiconductor memory device.

FIG. 2A illustrates a cross-sectional structure of the second conductive barrier film 16b in this embodiment, while FIG. 2B illustrates a cross-sectional structure of a conventional oxygen barrier film (corresponding to the second conductive barrier film 16b in this embodiment). Note that the film thickness is 200 nm or less for both the second conductive barrier film 16b and the conventional oxygen barrier film.

In the conventional oxygen barrier film shown in FIG. 2B, the average crystal grain size is equal to the thickness of the oxygen barrier film. Therefore, the diffusion paths for oxygen atoms are straight. On the contrary, in the second conductive barrier film 16b in this embodiment, since the average crystal grain size is a half of the thickness of the oxygen barrier film, the diffusion paths for oxygen atoms have curves. This makes it difficult for oxygen atoms to diffuse along the grain boundaries, and thus improves the oxygen barrier property of the second conductive barrier film 16b.

Figure 3:
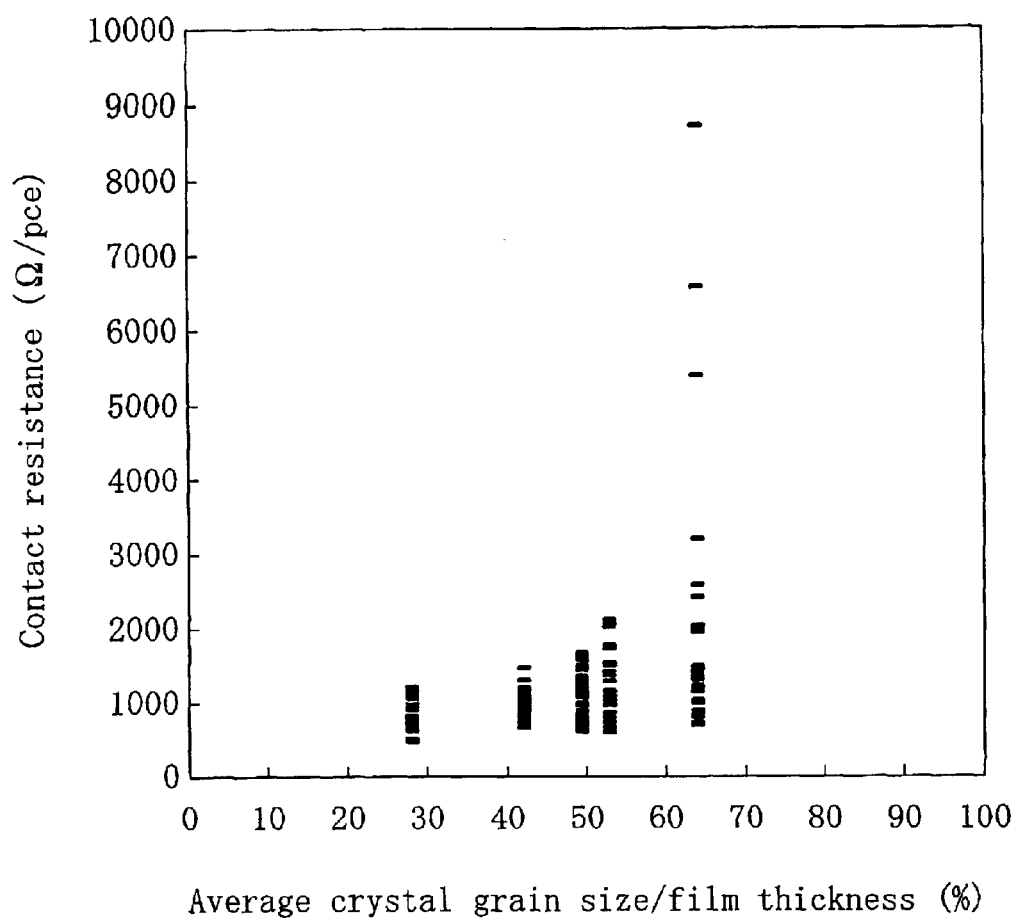
FIG. 3 is a view showing the relationship between the value of [average crystal grain size/film thickness] and the contact resistance of the second conductive barrier film (oxygen barrier film) of the semiconductor memory device of Embodiment 1 of the invention.

FIG. 3 shows the relationship between the value of [average crystal grain size/film thickness] of the second conductive barrier film 16b and the contact resistance. The contact resistance was measured in the following manner. A plurality of contact chains each composed of the drain region 12, the contact plug 15 and the lower electrode 16 of the semiconductor memory device of FIG. 1 were formed, and the contact resistances exhibited by the contact chains were evaluated. The y-axis of the graph of FIG. 3 represents the value of the contact resistance of one contact chain.

As is observed from FIG. 3, when the value of [average crystal grain size/film thickness] is 50% or less, the values of the contact resistance fall within the range of 2kΩ or less, in which no problem will arise during device operation, and also the variation of the contact resistance is small. On the contrary, the variation of the contact resistance becomes large when the value of [average crystal grain size/film thickness] exceeds 50%, and is considerably large when it exceeds 60%.

Hereinafter, the method for forming the second conductive barrier film (iridium oxide film) 16b of the semiconductor memory device of Embodiment 1 of the invention will be described.

First Fabrication Method of Embodiment 1

The first fabrication method is a method for forming an iridium oxide film by reactive sputtering with a parallel plate DC magnetron sputtering apparatus. An iridium oxide film made of granular crystals having an average grain size of a half or less of the film thickness is deposited on a substrate. Argon gas as an inert gas and oxygen gas as an active gas are fed into a reaction chamber.

To have a smaller crystal grain size, it is preferable to reduce the kinetic energy of grains moving on the surface of the substrate when the grains reach the substrate.

In view of the above, in the first fabrication method, the substrate temperature is made lower than room temperature. More specifically, the substrate is cooled to about 10° C., for example, with liquid nitrogen or the like. This reliably reduces the kinetic energy of grains reaching the substrate. Due to this reduction in kinetic energy, the average crystal grain size becomes as small as 80 nm or less. In this way, the average crystal grain size can be made a half or less of the film thickness.

This method has a problem that the iridium oxide film formed by reactive sputtering on the substrate having a temperature kept lower than room temperature is easily peeled off.

Second Fabrication Method of Embodiment 1

In the second fabrication method, also, an iridium oxide film is formed by reactive sputtering with a parallel plate DC magnetron sputtering apparatus. An iridium oxide film made of granular crystals having an average grain size of a half or less of the film thickness is deposited on a substrate. Argon gas as an inert gas and oxygen gas as an active gas are fed into a reaction chamber.

In the second fabrication method, to reduce the kinetic energy of grains reaching the substrate, the ratio of oxygen gas to argon gas is made large, to allow iridium atoms to be sputtered with oxygen atoms having a small mass. In this method, the ratio of oxygen gas to argon gas to be fed must be adjusted depending on the type of the apparatus, the pressure in the reaction chamber, the electric power for sputtering and the like. The reason is that there may occur a phenomenon that sputtered iridium atoms are coupled with oxygen atoms during flying (so-called getter effect).

Figure 4:
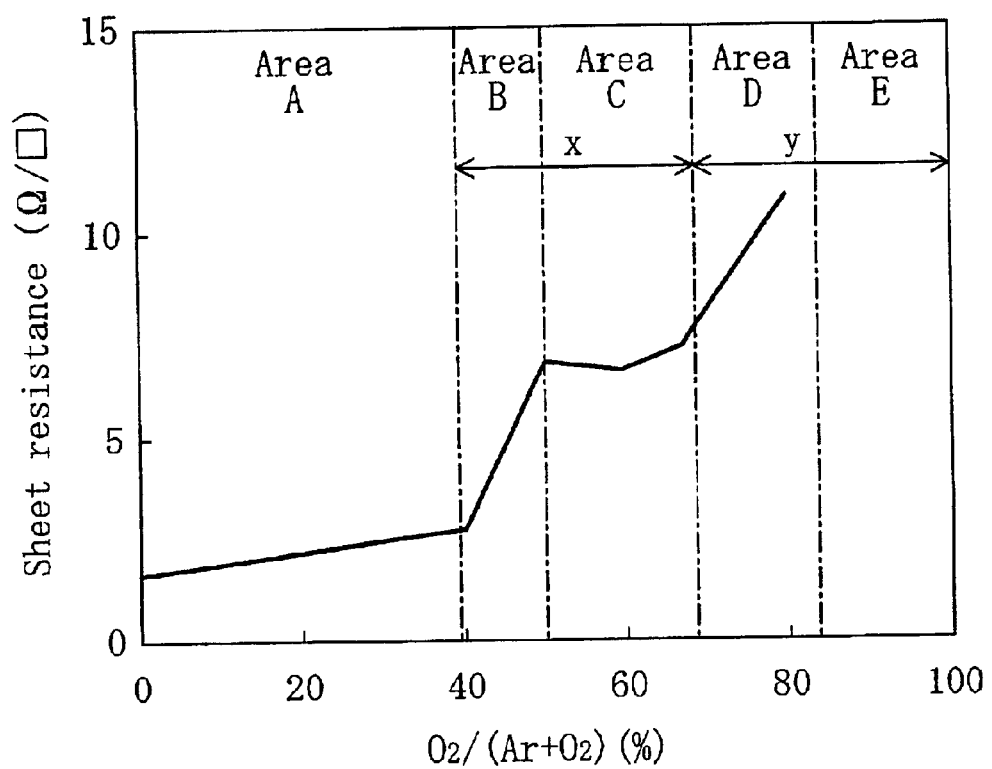
FIG. 4 is a view showing the relationship between the value of [flow of $O_2$ gas/(flow of $O_2$ gas + flow of Ar gas)] and the sheet resistance of the iridium oxide film observed during formation of the iridium oxide film by a method for fabricating the semiconductor memory device of Embodiment 1 of the invention.

FIG. 4 shows the relationship between the value of [flow of $O_2$ gas/(flow of $O_2$ gas + flow of Ar gas)] (hereinafter, simply called the oxygen gas ratio) and the sheet resistance of the iridium oxide film, that is, the dependence of the sheet resistance on the oxygen gas ratio, observed when the iridium oxide film (thickness: 160 nm) was formed by reactive sputtering with $O_2$ gas and Ar gas fed into a reaction chamber. In the reaction chamber, the pressure was set at 0.67 Pa, and the electric powder for sputtering was set at 1 kW. In this case, the sheet resistance must be 9 Ω/□ or more to ensure that the average grain size of the crystal grains constituting the iridium oxide film having a thickness of 160 nm is a half or less of the film thickness.

Referring to FIG. 4, in area A, oxygen atoms are consumed due to the getter effect. Therefore, in this area, the second conductive barrier film 16b is substantially an iridium film, and thus the sheet resistance is low.

In area B, the getter effect is saturated, and thus oxygen atoms in the reaction chamber increases. The surface of the target is therefore oxidized. Thus, with the increase Of $O_2$ gas, the sheet resistance of the second conductive barrier film 16b sharply increases.

In area C, the surface of the target is completely oxidized, and thus the second conductive barrier film 16b becomes entirely an iridium oxide film. In this state, the sheet resistance of the second conductive barrier film 16b; hardly changes despite of the increase Of $O_2$ gas.

In area D, the ratio of $O_2$ atoms to Ar atoms increases in the reaction chamber. Therefore, $O_2$ atoms, in place of Ar atoms, begin to collide against the target causing sputtering. Since $O_2$ atoms are small in mass and therefore small in momentum compared with Ar atoms, the proportion of the amount of sputtered grains becomes small and thus the deposition rate becomes low. In addition, since the kinetic energy of the sputtered grains decreases, the size of the grains constituting the second conductive barrier film 16b becomes small. Thus, the sheet resistance increases.

In area E, no discharge occurs because the flow of Ar gas is extremely small.

From the above, it is found that by performing sputtering under the condition of the area D, an iridium oxide film made of granular crystals having a small grain size can be obtained with reliability.

When the electric power for sputtering as one of the sputtering conditions is large, the current density for sputtering is high. With a high current density, the getter effect is significantly exhibited.

Figure 5:
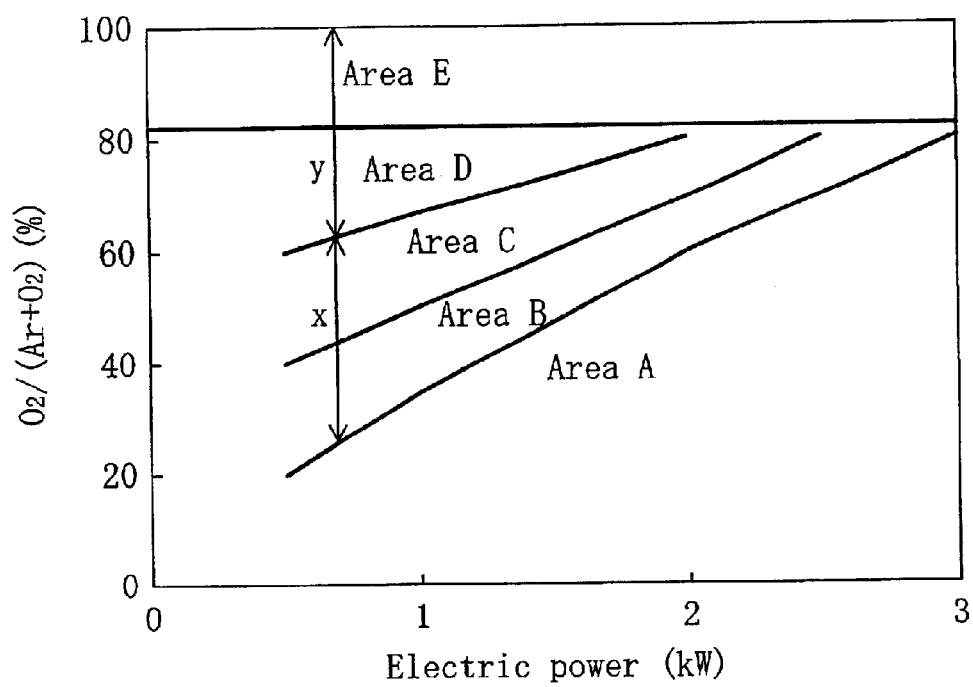
FIG. 5 is a view showing the relationship between the electric power for sputtering and the oxygen gas ratio observed during formation of the iridium oxide film by the method for fabricating the semiconductor memory device of Embodiment 1 of the invention.

FIG. 5 shows the relationship between the electric power for sputtering and the oxygen gas ratio, that is, the electric power dependence of the oxygen gas ratio, observed when the iridium oxide film was formed by reactive sputtering with $O_2$ gas and Ar gas fed into a reaction chamber. In the reaction chamber, the pressure was set at 0.67 Pa.

As is found from FIG. 5, as the electric power for sputtering increases, the area A, in which oxygen atoms are consumed due to the getter effect, becomes large. This increases the value of the oxygen gas ratio at which the area A shifts to the area B. With this increase, the value of the oxygen gas ratio at which the area B shifts to the area C and that at which the area C shifts to the area D increase.

Figure 6:
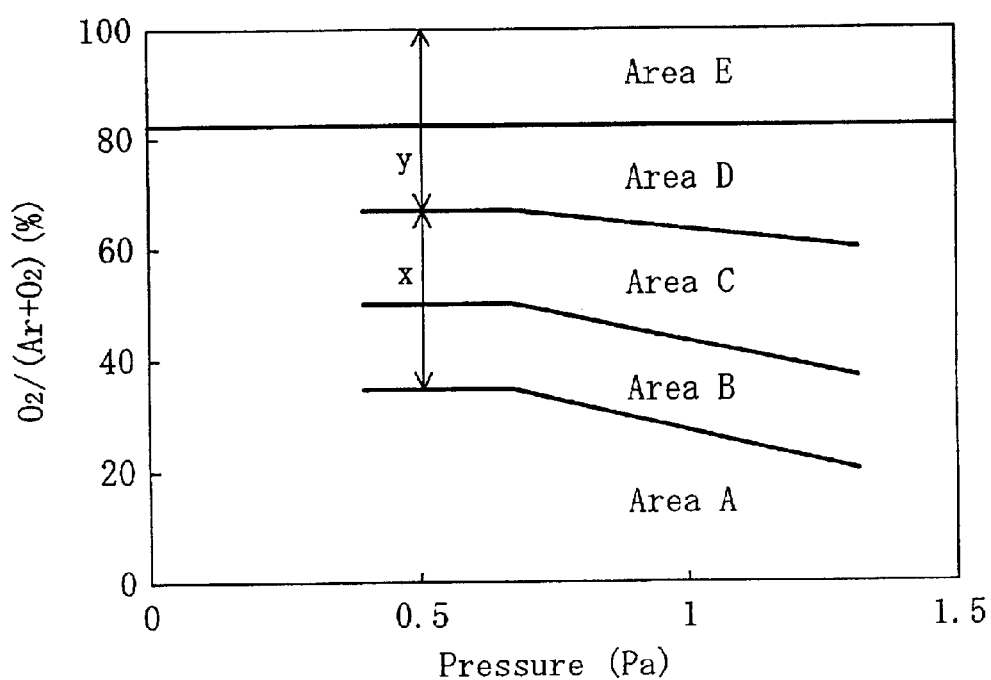
FIG. 6 is a view showing the relationship between the pressure in a reaction chamber and the oxygen gas ratio observed during formation of the iridium oxide film by the method for fabricating the semiconductor memory device of Embodiment 1 of the invention.

FIG. 6 shows the relationship between the pressure in the reaction chamber and the oxygen gas ratio, that is, the pressure dependence of the oxygen gas ratio, observed when the iridium oxide film was formed by reactive sputtering with $O_2$ gas and Ar gas fed into a reaction chamber. In the reaction chamber, the electric power for sputtering was set at 1 kW.

As is found from FIG. 6, as the pressure in the reaction chamber increases, the getter effect becomes less influential. This decreases the value of the oxygen gas ratio at which the area A shifts to the area B. With this decrease, the value of the oxygen gas ratio at which the area B shifts to the area C and that at which the area C shifts to the area D decreases.

The area D, that is, the area in which an iridium oxide film made of granular crystals having a small grain size can be obtained with reliability, is defined in the following manner.

The amount of the oxygen gas used for formation of the iridium oxide film is equal to the amount obtained by subtracting the amount of $O_2$ gas in the area A from the amount of $O_2$ gas fed into the reaction chamber. This corresponds to x in FIG. 4. The amount of Ar gas corresponds to y in FIG. 4.

Therefore, the area D must be an area satisfying $x/(x+y) > 0.5$. By performing reactive sputtering under the condition satisfying this expression, it is possible to form an iridium oxide film made of granular crystals having a small grain size with reliability.

In addition, since the iridium oxide film can be formed on the substrate having a temperature kept equal to or higher than room temperature, the adhesion of the iridium oxide film improves.

Embodiment 2

The semiconductor memory device and the fabrication method thereof of Embodiment 2 of the present invention will be described with reference to FIGS. 1 and 7.

The semiconductor memory device of Embodiment 2 has the same basic structure as the semiconductor memory device of Embodiment 1. That is, as shown in FIG. 1, a source region 11 and a drain region 12 are formed in the surface portion of a semiconductor substrate 10, and a gate electrode 13 is formed on the semiconductor substrate 10, constituting a field effect transistor (FET).

An interlayer insulating film 14 is formed on the resultant semiconductor substrate 10 covering the FET. A contact plug 15 made of polysilicon extends through the interlayer insulating film 14 to be in contact with the drain region 12.

A lower electrode 16 of a capacitor is formed on the interlayer insulating film 14 to be in contact with the contact plug 15. The lower electrode 16 is composed of a first conductive barrier film 16a, a second conductive barrier film 16b and a metal film 16c formed sequentially in this order.

Figure 7:
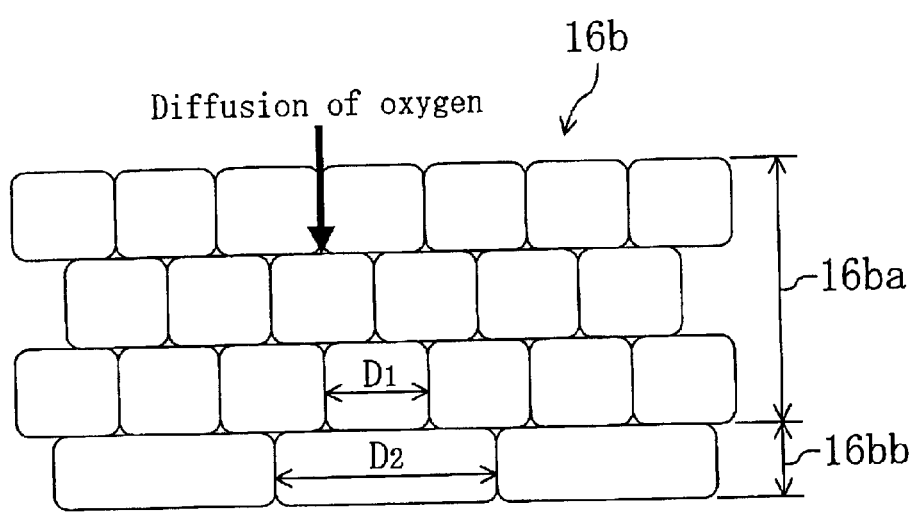
FIG. 7 is a cross-sectional view of a second conductive barrier film (oxygen barrier film) of a semiconductor memory device of Embodiment 2 of the present invention

FIG. 7 illustrates a cross-sectional structure of the second conductive barrier film 16b, which has a layered structure composed of an upper layer 16ba serving as an oxygen barrier layer and a lower layer 16bb for improving the adhesion to the first conductive barrier film 16a.

The upper layer 16ba is made of granular crystals. The lower layer 16bb, which may be made of granular crystals, has an average crystal grain size $D_2$ greater than an average crystal grain size $D_1$ of the upper layer 16ba. Note that the average crystal grain sizes $D_1$ and $D_2$ as used herein refer to the sizes in the direction of the plane of the second conductive barrier film 16b because the thickness of the lower layer 16bb may be smaller than the crystal grain size thereof as shown in FIG. 7.

Note also that the average crystal grain size $D_1$ of the upper layer 16ba is a half or less of the thickness of the upper layer 16ba.

The lower layer 16bb, serving as an adhering layer, is poor in oxygen barrier property. Therefore, the thickness of the lower layer 16bb is preferably as small as possible as long as the adhesion is secured. Specifically, the thickness of the lower layer 16bb is about 5 nm to about 30 nm, preferably about 10 nm.

The thickness of the upper layer 16ba, serving as an oxygen barrier layer, is preferably as large as possible allowed by the film formation. Specifically, the thickness of the upper layer 16ba is at least twice the average crystal grain size $D_1$ of the upper layer 16ba and 200 nm or less.

Fabrication Method of Embodiment 2

Hereinafter, a method for forming the second conductive barrier film (iridium oxide film) 16b of the semiconductor memory device of Embodiment 2 of the invention will be described.

In the fabrication method of Embodiment 2, as in Embodiment 1, the iridium oxide film 16b is formed by reactive sputtering with a parallel plate type DC magnetron sputtering apparatus. An iridium oxide film made of granular crystals having an average grain size of a half or less of the film thickness is deposited on a substrate. Argon gas as an inert gas and oxygen as an active gas are fed into a reaction chamber.

The crystal grain size can be made small by reducing the kinetic energy of grains reaching the substrate. With reduced kinetic energy, however, sputtered grains are not easily bombarded into the substrate. This fails to form an adhering layer between the iridium oxide film and the substrate, and thus deteriorates the adhesion of the iridium oxide film to the substrate.

To overcome the above problem, sputtering is preferably performed in two stages. The first stage of sputtering adopts a condition under which the kinetic energy of sputtered grains is high, to form an adhering layer. The second stage of sputtering adopts a condition under which the kinetic energy of sputtered grains is low, to reduce the crystal grain size.

More specifically, preferably, sputtering is performed under the condition of $x/(x+y) < 0.5$ in the first stage, and thereafter, under the condition of $x/(x+y) > 0.5$ in the second stage. In this formation method, the iridium oxide film formed in the first stage is preferably as thin as possible because it is poor in oxygen barrier property. Specifically, the thickness of the iridium oxide film formed in the first stage is preferably 30 nm or less, more preferably about 20 nm.

In the above three fabrication methods, it is possible to form an iridium oxide film made of granular crystals having an average grain size of a half or less of the film thickness. Preferably, the iridium oxide film formed by sputtering is compacted by heat treatment at a temperature in the range of 500° C. to 600° C, such as 550° C. The reason why the lower limit is preferably 500° C. is to ensure sufficient sintering for compacting the film. The reason why the upper limit is preferably 600° C. is to prevent generation of coarse surface morphology due to oxidation of unreacted iridium.

Thus, the compactness of the grain boundaries of the iridium oxide film serving as diffusion paths for oxygen atoms improves by subjecting the iridium oxide film to heat treatment at a temperature in the range of 500° C. to 600° C. after sputtering. This further improves the oxygen barrier property of the iridium oxide film.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device comprising:
   an interlayer insulating film formed on a semiconductor substrate;
   a contact plug formed to extend through the interlayer insulating film; and
   a capacitor formed on the interlayer insulating film, an electrode of the capacitor being connected with the contact plug,
   wherein the electrode has a conductive barrier film provided in the lower portion and an iridium oxide film provided in the upper portion as an oxygen barrier film,
   the iridium oxide film covers the top and the sides of the conductive barrier film, and
   the average grain size of granular crystals constituting the iridium oxide film is a half or less of the thickness of the iridium oxide film.

2. The device of claim 1, wherein the thickness of the iridium oxide film is 200 nm or less.

3. A semiconductor memory device comprising:
   an interlayer insulating film formed on a semiconductor substrate;
   a contact plug formed to extend through the interlayer insulating film; and
   a capacitor formed on the interlayer insulating film, an electrode of the capacitor being connected with the contact plug,
   wherein the electrode has an iridium oxide film as an oxygen barrier film, and
   the iridium oxide film has a plurality of layers different in average crystal grain size from each other.

4. The device of claim 3, wherein a lower layer of the plurality of layers has a comparatively large average crystal grain size, and an upper layer of the plurality of layers has a comparatively small average crystal grain size.

5. The device of claim 4, wherein the thickness of the lower layer is 30 nm or less, and the thickness of the upper layer is 200 nm or less.

6. A semiconductor memory device comprising:
   a field effect transistor formed on a semiconductor substrate;
   an interlayer insulating film formed to cover the field effect transistor;
   a contact plug formed to extend through the interlayer insulating film and connected with a source region or a drain region of the field effect transistor; and
   a capacitor formed on the interlayer insulating film, a lower electrode of the capacitor being connected with the contact plug,
   wherein the lower electrode has a conductive barrier film provided in the lower portion and an iridium oxide film provided in the upper portion as an oxygen barrier film,
   the iridium oxide film covers the top and sides of the conductive barrier film, and
   the average grain size of granular crystals constituting the iridium oxide film is a half or less of the thickness of the iridium oxide film.

7. The device of claim 6, wherein the thickness of the iridium oxide film is 200 nm or less.

8. A semiconductor memory device comprising:
   a field effect transistor formed on a semiconductor substrate;
   an interlayer insulating film formed to cover the field effect transistor;
   a contact plug formed to extend through the interlayer insulating film and connected with a source region or a drain region of the field effect transistor; and
   a capacitor formed on the interlayer insulating film, a lower electrode of the capacitor being connected with the contact plug,
   wherein the lower electrode has an iridium oxide film as an oxygen barrier film, and
   the iridium oxide film has a plurality of layers different in average crystal grain size from each other.

9. The device of claim 8, wherein a lower layer of the plurality of layers has a comparatively large average crystal grain size, and an upper layer of the plurality of layers has a comparatively small average crystal grain size.

10. The device of claim 9, wherein the thickness of the lower layer is 30 nm or less, and the thickness of the upper layer is 200 nm or less.

* * * * *

UNITED STATES PATENT AND TRADEMARK OFFICE
CERTIFICATE OF CORRECTION

PATENT NO. : 6,781,179 B2
DATED : August 24, 2004
INVENTOR(S) : Toru Nasu et al.

It is certified that error appears in the above-identified patent and that said Letters Patent is hereby corrected as shown below:

Title page,
After Item [57], ABSTRACT, change "10 Claims" to -- 12 Claims --;

Column 12,
Line 48, add the following two claims:
    11. A semiconductor memory device comprising:
    an interlayer insulating film formed on a semiconductor substrate;
    a contact plug formed to extend through the interlayer insulating film; and
    a capacitor formed on the interlayer insulating film, an electrode of the capacitor being connected with the contact plug,
    wherein the electrode has an iridium oxide film as an oxygen barrier film for preventing the diffusion of oxygen to the contact plug, and
    the average grain size of granular crystals constituting the iridium oxide film is a half or less of the thickness of the iridium oxide film.

12. A semiconductor memory device comprising;
    a field effect transistor formed on a semiconductor substrate;
    an interlayer insulating film formed to cover the field effect transistor;
    a contact plug formed to extend through the interlayer insulating film and connected with a source region or a drain region of the field effect transistor; and
    a capacitor formed on the interlayer insulating film, a lower electrode of the capacitor being connected with the contact plug,
    wherein the lower electrode has an iridium oxide film provided as an oxygen barrier film for preventing the diffusion of oxygen to the contact plug, and
    the average grain size of granular crystals constituting the iridium oxide film is a half or less of the thickness of the iridium oxide film.

Signed and Sealed this

Twenty-sixth Day of July, 2005

JON W. DUDAS
*Director of the United States Patent and Trademark Office*